(12) United States Patent
Chen

(10) Patent No.: US 7,009,314 B2
(45) Date of Patent: Mar. 7, 2006

(54) ONE-WAY SWITCH

(75) Inventor: Seng-Feng Chen, Taipei (TW)

(73) Assignee: Quanta Computer, Inc., Tao Yuan Shien (TW)

(*) Notice: Subject to any disclaimer, the term of this patent is extended or adjusted under 35 U.S.C. 154(b) by 494 days.

(21) Appl. No.: 10/337,063

(22) Filed: Jan. 6, 2003

(65) Prior Publication Data
US 2004/0080354 A1 Apr. 29, 2004

(30) Foreign Application Priority Data
Oct. 23, 2002 (TW) .............................. 91124453 A

(51) Int. Cl.
H01H 47/00 (2006.01)

(52) U.S. Cl. ...................................... 307/130; 327/365

(58) Field of Classification Search ................. 307/130
See application file for complete search history.

(56) References Cited

U.S. PATENT DOCUMENTS 6,400,616 B1 * 6/2002 Tamura et al. .............. 365/198
6,469,564 B1 * 10/2002 Jansen ......................... 327/365

* cited by examiner

Primary Examiner—Brian Sircus
Assistant Examiner—Dru Parries
(74) Attorney, Agent, or Firm—Thomas, Kayden, Horstemeyer & Risley, LLP

(57) ABSTRACT

A one-way switch comprises a metal-oxide semiconductor field-effect transistor (MOSFET) and a driver. Source and drain of the transistor function as P-terminal and N-terminal of the one-way switch. The driver, such as comparator or amplifier, is used to detect the voltage difference between the source and drain of the MOSFET. When the voltage of the P-terminal is higher than that of the N-terminal, the driver 150 outputs a driving voltage to gate of the MOSFET to turn on the MOSFET. If the voltage of P-terminal is lower than that of the N-terminal, the driver 150 cannot output voltage to turn on the MOSFET, and the one-way switch is off. Therefore, the one-way switch has the characteristic of workings in one direction.

7 Claims, 4 Drawing Sheets

ONE-WAY SWITCH

This application claims the benefit of Taiwan application Serial No. 091124453, filed Oct. 23, 2002.

BACKGROUND OF THE INVENTION

1. Field of the Invention

The invention relates in general to a one-way switch, and more particularly to a one-way switch with low forward voltage.

2. Description of the Related Art

Diode is a widely used electric circuit device and has been utilized for a long period of time. Its feature of working in one single direction enables the diode to apply in several kinds of circuits and thus the importance thereof is not less than the resistor and capacitor. Although diode is wildly used, it has intrinsic defects of high forward voltage as turning on greatly limits its application.

Generally, the forward voltage of a diode is about 0.7 volt (V). And as a physical property, it is hard to be reduced. As a result of the advance of the semiconductor manufacturing process, Schottky diode with lower forward voltage of about 0.4 volt (V) is obtained. However, still, Schottky diode cannot meet the critical requirements of working in an even lower forward voltage and the waste on power of MOS of Schottky diode is still high. Therefore, it is highly demanded to develop a one-way switch with low forward voltage to reduce waste of power.

SUMMARY OF THE INVENTION

The object of the present invention is to provide a one-way switch to realize working in one direction with low forward bias.

Therefore, the present invention provides a one-way switch comprises a metal oxide semiconductor field effect transistor (MOSFET) and a driver. Source and drain of the MOSFET function as N-terminal and P-terminal respectively. The driver is such as comparator or amplifier and used to detect the voltage difference between drain and source of the MOSFET. When the voltage of the P-terminal is higher than that of the N-terminal, the driver 150 outputs a driving voltage to the gate of the MOSFET to turn on the MOSFET. When the MOSFET is turned on, the current flows from P-terminal to N-terminal through the MOSFET. On the contrary, if the voltage of P-terminal is lower than that of N-terminal, the driver cannot output the needed driving voltage to turn on the MOSFET, therefore, the P-terminal and N-terminal are open, that is, the one-way switch is turned off.

Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment

When a metal oxide semiconductor field effect transistor (MOSFET) is turned on, the forward voltage between drain and source is pretty low. If the metal oxide semiconductor field effect transistor can be modified to work in one single direction, the metal oxide semiconductor field effect transistor can have all functions of the diode and work even better. It is known with the ones skilled in the art that the typical diode has P-terminal and N-terminal. Ideally, when the P-terminal voltage is higher than the N-terminal voltage, the diode is turned on, which is equivalent to short circuit. When the P-terminal voltage is lower than the N-terminal potential, the diode is turned off, which is equivalent to open circuit. Therefore, the diode has the characteristic of working in one direction. The one-way switch provided by the present invention also has a P-terminal and an N-terminal and it also has the characteristic of working in one direction. The detailed description of the one-way switch of the invention is as follows.

Figure 1:
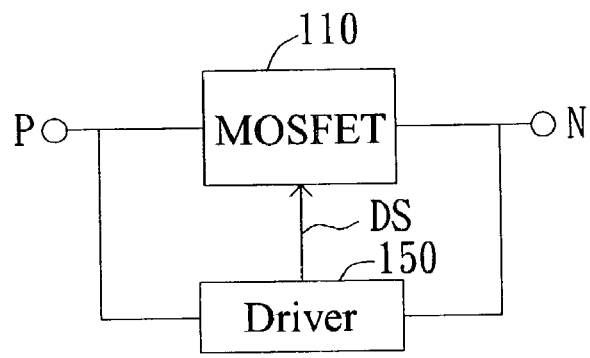
FIG. 1 shows a block diagram of a one-way switch according to the first embodiment of the present invention.

Referring to FIG. 1, it is a block diagram of a one-way switch according to the first embodiment of the present invention. The one-way switch comprises a metal oxide semiconductor field effect transistor (MOSFET) 110 and a driver 150. Drain and source of the MOSFET 110 function as the P-terminal and N-terminal respectively. (Drain/Source does not determinatively function as P-terminal or N-terminal. The function thereof depends on the request, which will be described in following specification.) The driver 150 is used to detect the voltage difference between the source and the drain of the MOSFET 110. When the voltage of the P-terminal is higher than that of the N-terminal, the driver 150 outputs a driving voltage DS to the gate of the MOSFET 110 so that the MOSFET 110 is turned on and the current flows from the P-terminal to N-terminal through the MOSFET 110. On the contrary, if the voltage of P-terminal is lower than that of the N-terminal, the driver 150 cannot output enough driving voltage DS to turn on the MOSFET 110, and thus the P-terminal and N-terminal are open, that is, the one-way switch is off.

Figure 2:
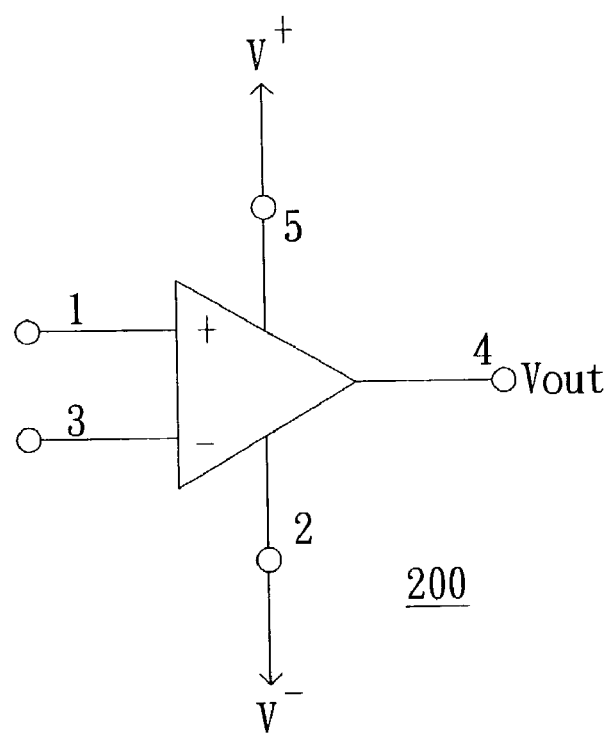
FIG. 2 shows definitions of pins of the operation amplifier.

A variety of electric circuits satisfy the request of being the driver 150 as described above. Examples like the comparator and the amplifier obtain the all functions of the driver 150 working in the one-way switch of the invention. The operation amplifier (OP) is a common device for realizing the function of the comparator and the amplifier. Therefore, the operation amplifier is taken as an example. Referring to FIG. 2, it shows the definitions of pins of the operation amplifier. The operation amplifier 200 comprises a non-inverting input terminal 1, an inverting input terminal 3, a high power terminal 5, a low power terminal 2 and an output terminal 4. The non-inverting input terminal 1 and the inverting input terminal 3 are signal input terminals, and the output terminal 4 is a signal output terminal. The high power terminal 5 and low power terminal 2 need to connect to high power level V+ and low power level V− respectively to gain the required power for operating the operation amplifier 200.

Figure 3:
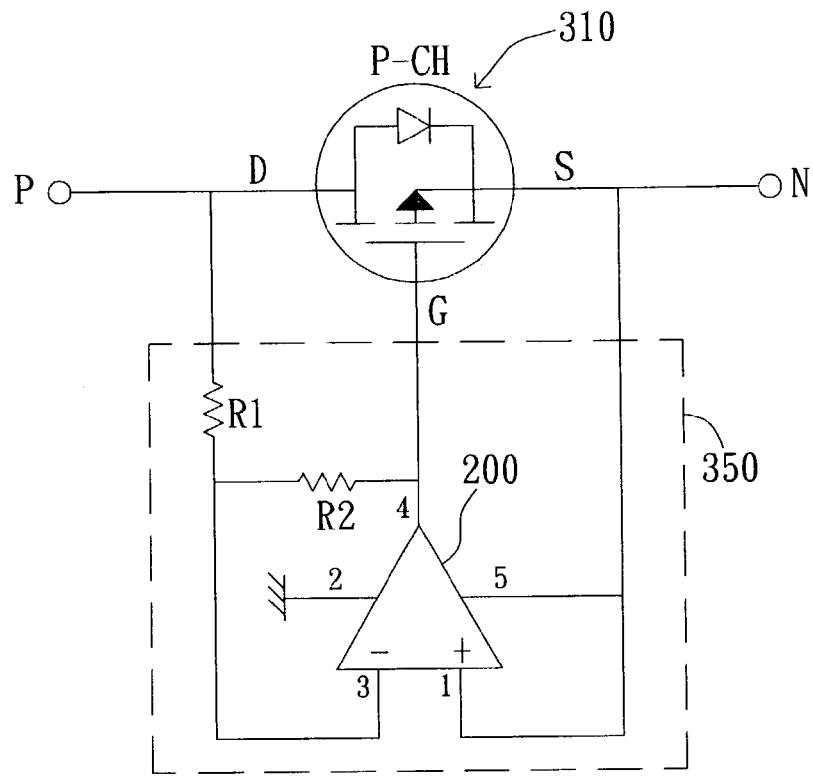
FIG. 3 shows a circuit diagram of the one-way switch according to the first embodiment of the present invention.

Referring to FIG. 3, it shows a circuit diagram of one-way switch according to the first embodiment of the present invention. The one-way switch comprises a metal oxide semiconductor field effect transistor (MOSFET) 310 and a driver 350. The MOSFET 310 is P channel transistor, i.e. PMOS, wherein the drain functions as the P-terminal, and the source functions as the N-terminal. The driver 350 is an inverting amplifier comprising an operation amplifier 200 and the resistors R1 and R2. The operation amplifier 200 comprises a non-inverting input terminal 1, an inverting input terminal 3, a high power terminal 5, a low power terminal 2 and an output terminal 4. The non-inverting input terminal 1 is coupled to the source S, the output terminal 4 is coupled to the gate G, the inverting input terminal 3 is coupled to one terminal of the resistor R1, and the other terminal of the resistor R1 is coupled to the drain D. One terminal of the resistor R2 is coupled to the inverting input terminal 3, and the other terminal of the resistor R2 is coupled to the output terminal 4. The high power terminal 5 is coupled to the source S and the low power terminal 2 is grounded so as to gain the required power for operating the operation amplifier 200.

Figure 4:
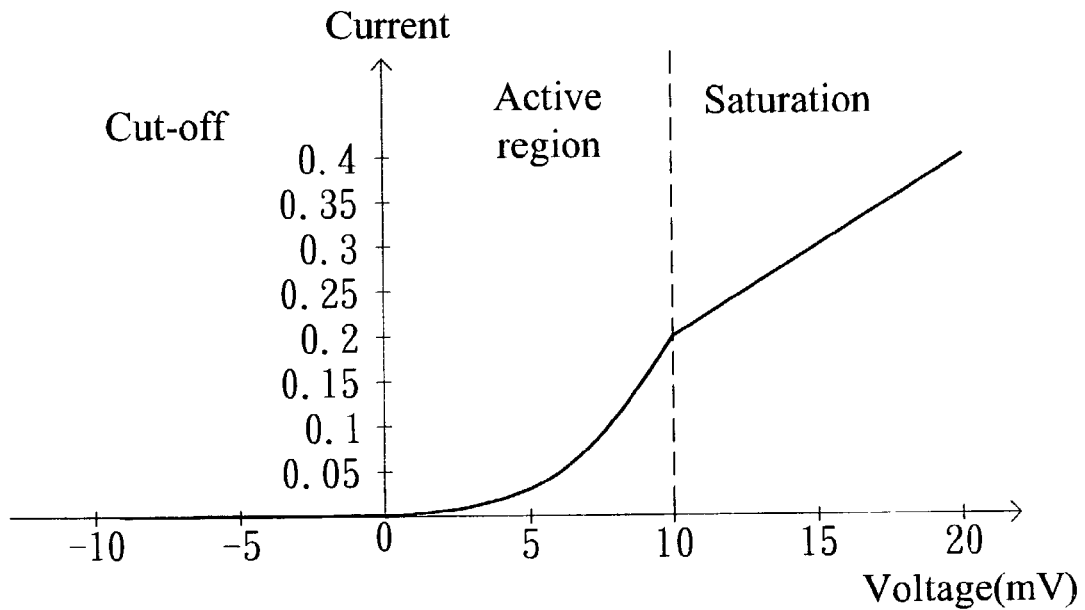
FIG. 4 shows a voltage-current curve of the one-way switch.

The working mechanism of FIG. 3 is described herebelow. The P-terminal and the N-terminal of the one-way switch are equivalent to the P-terminal and the N-terminal of the diode. Assuming the voltage of the N-terminal is 5V, the resistance between the drain D and the source S is 0.05 ohm as the MOSFET 310 is on, the resistance of the resistor R1 is 10 k ohm, and the resistance of the resistor R2 is 5 M ohm. As forward biasing, the voltage of P-terminal is higher than N-terminal. The amplifying theory of the amplifier says, $(R2/R1)*Vi=-Vo$, wherein Vi is the input voltage of the operation amplifier 200 and Vo is the output voltage. Assuming that when the MOSFET 310 is completely turned on, the voltage of the gate G is −5 V (by using the non-inverting input terminal 1 of the operation amplifier 200 as a reference point). Because the voltage of the gate G is equal to the output voltage of the operation amplifier 200, the P-terminal voltage should be higher than the N-terminal for at least 10 mV (5M/10K*10 mV=−5V) to completely turn on the MOSFET 310. Because the forward current for the working MOSFET 310 is about 0.2 ampere (A) (10 mV/0.05Ω=0.2 A), the MOSFET 310 can completely turn on as the forward current is larger than 0.2 ampere (A). In other words, the forward voltage (VF) from P-terminal to N-terminal is equal to the product of forward current and 0.05Ω. If the forward current is 1 ampere (A), the corresponding forward voltage is only 0.05 volt (V) which is much lower than that of the Schottky Diode, which is about 0.4 volt (V). The voltage-current curve of the one-way switch is shown in FIG. 4. The forward voltage can be adjusted to minimum by modifying the resistors R1 and R2.

Referring to FIG. 4, when the forward current is lower than 0.2 ampere (A), the MOSFET 310 cannot be completely turned on and the resistance of the MOSFET 310 increases along with the decrease of forward current. While the current diminishes to zero, the MOSFET 310 is completely turned off. Therefore, when the forward voltage between the P-terminal and N-terminal is between 0 and 10 mV, the relation of the voltage and current is not linear but depends on the characteristics of the transistor.

As the voltage of the N-terminal voltage is higher than the P-terminal, i.e. backward bias, the voltage of the non-inverting input terminal 1 is higher than that of the inverting input terminal 3. Under such conditions, the operation amplifier 200 outputs a high voltage and completely turn off the MOSFET 310. Therefore, the one-way switch is turned off under backward bias but turned on under forward bias. That is to say, the one-way switch of the invention is able to work in one direction.

Moreover, the resistor R1, the resistor R2 and the gate breakover voltage of the MOSFET 310 determine the cut-in voltage of the forward voltage. The cut-in voltage of the forward voltage is equal to the gate breakover voltage multiplied by (R1/R2). In this embodiment, the cut-in voltage of the forward voltage is about 10 mV. In practice, the cut-in voltage of the forward voltage can be increased to be larger than the offset voltage of the operation amplifier to avoid the generating of the inverting current. One of the methods of increasing the cut-in voltage of the forward voltage is adjusting the ratio of resistance R1 and R2.

Figure 5:
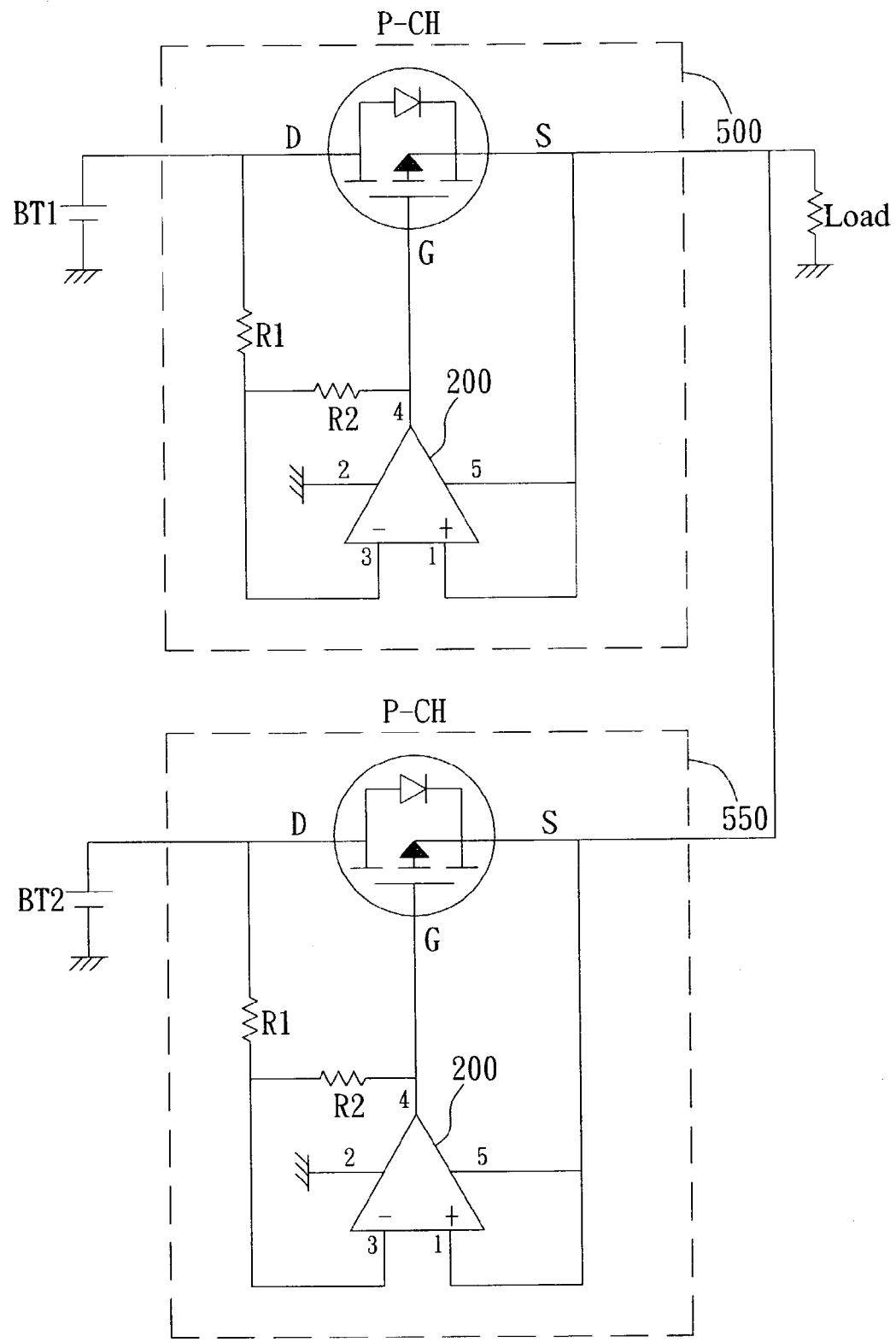
FIG. 5 shows the application of the one-way switch in power supply circuit.

Referring to FIG. 5, it shows the application of the one-way switch of the invention in a power supply circuit. Batteries BT1 and BT2 provide the power for the load, such as a notebook computer. When the voltage of the battery BT1 is higher than that of the battery BT2, because the one-way switch 500 is forward biased and the other one-way switch 550 is backward biased, the one-way switch 500 is turned on and the other one-way switch 550 is turned off. Hence, the load gets power supply from the battery BT1 with higher voltage. On the contrary, when the voltage of the battery BT1 is lower than that of the battery BT2, the load gets power supply from the battery BT2 with higher voltage.

Second Embodiment

Figure 6:
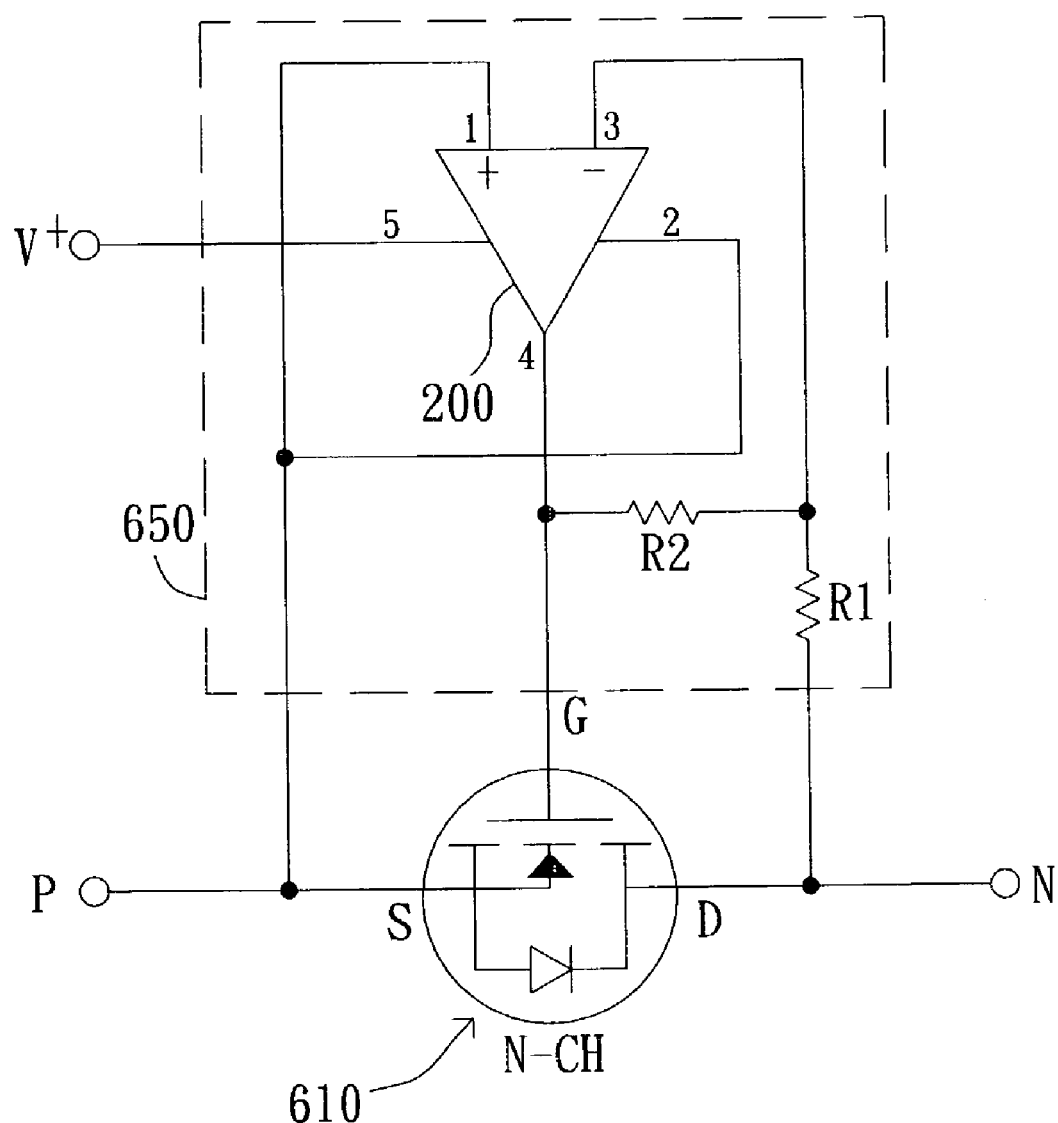
FIG. 6 shows a circuit diagram of the one-way switch according to the second embodiment of the present invention.

Referring to FIG. 6, it shows a circuit diagram of another one-way switch according to the second embodiment of the present invention. The one-way switch comprises a MOSFET 610 and a driver 650 coupled with each other. The MOSFET 610 is an N channel transistor, i.e. NMOS. The source S and the drain D function as P-terminal and N-terminal. The driver 650 is an inverting amplifier composed of an operation amplifier 200, a resistor R1 and a resistor R2. The non-inverting input terminal 1 is coupled to the source S, the output terminal 4 is coupled to the gate G, the inverting input terminal 3 is coupled to one terminal of the resistor R1, and the other terminal of the resistor R1 is coupled to the drain D. One terminal of the resistor R2 is coupled the inverting input terminal 3, and the other terminal of the resistor R2 is coupled to the output terminal 4. The high power terminal 5 is coupled to the power V+which has higher voltage than the source S. The low power terminal 2 is coupled to the source S so as to get power to operate the operation amplifier 200.

The significant differences between the first and second embodiments include that the MOSFET 610 is NMOS and the high power terminal 5 is coupled to the power V+. The one-way switch of the first embodiment fits the operation amplifier with power lower than N-terminal, and the one-way switch of the second embodiment fits the operation amplifier with power higher than P-terminal. In the second embodiment, the output voltage of the operation amplifier 200 is equal to the forward voltage between P-terminal and N-terminal multiplied by R2/R1 (by using the non-inverting input terminal 1 of the operation amplifier 200 as a reference point). If the gate breakover voltage of the MOSFET 610 is 5 volt (V), the resistance of the resistor R1 is 10 K ohm (Ω), and the resistance of the resistor R2 is 5 M ohm (Ω), the cut-in voltage of the forward voltage is only about 10 mV.

The present invention discloses the one-way switch which has at least the following advantages:
1. The forward voltage of the diode equivalent circuit is low.
2. The backward leakage current is lower than Schottky Diode.
3. The device can be forward turned on and backward turned off exactly without large backward current.
4. The MOSFET changes gradually, while it works from the forward saturation region to the active region and to the backward cut-off region. Hence, the operation amplifier is stable without oscillation even when it approaches the zero point.
5. The one-way switch of the invention can be used in a rectifier circuit and thus increase the efficiency.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A one-way switch having a P-terminal and an N-terminal, comprising:
   a P channel transistor having a source, a drain and a gate, and the drain functions as the P-terminal, and the source functions as the N-terminal; and
   a driver coupled to the P channel transistor to turn on the P channel transistor in one direction, the driver comprising:
      an operation amplifier with an inverting input terminal, a non-inverting input terminal and an output terminal, wherein the non-inverting input terminal is coupled to the source, and the output terminal is coupled to the gate;
      a first resistor, one terminal of the first resistor coupled to the drain and the other terminal of the first resistor coupled to the inverting input terminal; and
      a second resistor, one terminal of the second resistor coupled to the inverting input terminal, the other terminal of the second resistor coupled to the output terminal.

2. The one-way switch according to claim 1, wherein the operation amplifier comprises a high power terminal coupled to the source and a low power terminal grounded, the voltage of the high power terminal higher than the low power terminal.

3. The one-way switch according to claim 1, wherein the P channel transistor is a metal oxide semiconductor field effect transistor (MOSFET).

4. A one-way switch having a P-terminal and an N-terminal, comprising:
   a N channel transistor having a source, a drain and a gate, wherein the drain functions as the N-terminal, and the source functions as the P-terminal; and
   a driver coupled to the N channel transistor to turn on the N channel transistor in one direction, the driver comprising:
      an operation amplifier with an inverting input terminal, a non-inverting input terminal and an output terminal, wherein the non-inverting input terminal is coupled to the source, and the output terminal is coupled to the gate;
      a first resistor, one terminal of the first resistor coupled to the drain and the other terminal of the first resistor coupled to the inverting input terminal; and
      a second resistor, one terminal of the second resistor coupled to the inverting input terminal, the other terminal of the second resistor coupled to the output terminal.

5. The one-way switch according to claim 4, wherein the operation amplifier comprises a high power terminal and a low power terminal.

6. The one-way switch according to claim 5, wherein the low power terminal is coupled to the source, and the voltage of the high power terminal is higher than the source.

7. The one-way switch according to claim 4, wherein the N channel transistor is a metal oxide semiconductor field effect transistor (MOSFET).

* * * * *